US008766257B2

(12) United States Patent
Matusiewicz

(10) Patent No.: US 8,766,257 B2
(45) Date of Patent: Jul. 1, 2014

(54) TEST PAD STRUCTURE FOR REUSE OF INTERCONNECT LEVEL MASKS

(75) Inventor: Gerald Matusiewicz, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/607,674

(22) Filed: Sep. 8, 2012

(65) Prior Publication Data

US 2013/0001552 A1 Jan. 3, 2013

Related U.S. Application Data

(63) Continuation of application No. 12/731,469, filed on Mar. 25, 2010, now Pat. No. 8,357,932.

(51) Int. Cl.
*H01L 23/544* (2006.01)
*H01L 21/768* (2006.01)

(52) U.S. Cl.
USPC ............... 257/48; 257/E23.179; 257/E21.59; 438/631; 438/13

(58) Field of Classification Search
None
See application file for complete search history.

(56) References Cited

U.S. PATENT DOCUMENTS

| 4,479,088 | A  |   | 10/1984 | Stopper |        |
|-----------|----|---|---------|---------|--------|
| 5,585,675 | A  | * | 12/1996 | Knopf ............................ | 257/774 |
| 6,236,114 | B1 | * | 5/2001  | Huang et al. .................. | 257/758 |
| 6,448,634 | B1 |   | 9/2002  | Hashimoto |     |
| 6,448,661 | B1 | * | 9/2002  | Kim et al. ..................... | 257/777 |
| 7,928,579 | B2 | * | 4/2011  | Wark et al. .................... | 257/774 |

* cited by examiner

*Primary Examiner* — Thomas L Dickey
*Assistant Examiner* — Joseph Schoenholtz
(74) *Attorney, Agent, or Firm* — Scully, Scott, Murphy & Presser, P.C.; Parashos T. Kalaitzis, Esq.

(57) ABSTRACT

A test pad structure in a back-end-of-line metal interconnect structure is formed by repeated use of the same mask set, which includes a first line level mask, a first via level mask, a second line level mask, and a second via level mask. The test pad structure includes a two-dimensional array of test pads such that a first row is connected to a device macro structure in the same level, and test pads in another row are electrically connected to another device macro structure of the same design at an underlying level. The lateral shifting of electrical connection among pads located at different levels is enabled by lateral extension portions that protrude from pads and via structures that contact the lateral extension portions. This test pad structure includes more levels of testable metal interconnect structure than the number of used lithographic masks.

20 Claims, 10 Drawing Sheets

TEST PAD STRUCTURE FOR REUSE OF INTERCONNECT LEVEL MASKS

CROSS REFERENCE TO RELATED APPLICATION

This application is a continuation of U.S. patent application Ser. No. 12/731,469, filed Mar. 25, 2010, the entire contents and disclosure of which are incorporated herein by reference.

BACKGROUND

The present invention relates to a metal interconnect structure including a test pad structure that enables access to test structures at various levels by repeated use of a same mask set, methods of forming the same, and a mask set for effecting the manufacture of the same.

Test sites refer to a mask set including patterns for manufacturing a semiconductor chip including testable devices. Test sites are typically designed to include a predetermined number of metal levels. To qualify a new generation of technology, however, multiple types of builds having different numbers of metal levels are sometimes necessary.

Masks are expensive and account for a significant fraction of the total development cost in qualifying new technology. If mask sets for all optional build levels are fabricated, the cost of the additional mask sets are added to the cost of the basic mask set as development cost. Nonetheless, qualification of the new technology requires building hardware including the optional metal levels and testing the functionality of test structures in such optional levels.

If the same masks are employed more than once, this configuration results in parallel structures within which a lower level structure is electrically shorted to an upper level structure having the same pattern. For example, masks for the basic levels can be employed more than once to build hardware including optional levels by using the masks for the basic levels to pattern structures in the optional levels. However, any test structure within one of the optional levels (which is typically the upper levels) is electrically shorted to a congruent test structure within one of the basic levels because the patterns are the same if conventional test pad structures are employed. Consequently, any attempted testing of a test structure in one of the optional levels necessary results in testing of two test structures in parallel, i.e., testing of two test structures that are electrically shorted to each other trough overlying test pads. Thus, reuse of conventional mask sets is an inadequate method for testing structures in optional metal levels.

SUMMARY

An embodiment of the present invention provides metal interconnect structures including test pad structures located in optional metal levels by employing a two-dimensional array of pads at each level and by providing a scheme that laterally shifts electrical connections among pads among metal levels. Another embodiment of the present invention provides a method of manufacturing such metal interconnect structures. Yet another embodiment of the present invention provides mask sets that can be employed to enable such structures and methods.

A test pad structure in a back-end-of-line metal interconnect structure is formed by repeated use of the same mask set, which includes a first line level mask, a first via level mask, a second line level mask, and a second via level mask. The test pad structure includes a two-dimensional array of test pads such that a first row is connected to a device macro structure in the same level, and test pads in another row are electrically connected to another device macro structure of the same design at an underlying level. The lateral shifting of electrical connection among pads located at different levels is enabled by lateral extension portions that protrude from pads and via structures that contact the lateral extension portions. The test pad structure enables testing of device macros at each line level as well as device macros of identical design in at least one underlying metal level. The test pad structure can be built by repeated use of the same mask set, allowing construction of more levels of testable metal interconnect structure than the number of mask levels.

According to an embodiment of the present invention, a structure including, from bottom to top, a first line level structure, a first via level structure, and a second line level structure, is provided. The first line level structure includes a first array of first metal pads, and a first lateral extension portion protrudes from each of the first metal pads. The first via level structure includes first metal vias, and each of the first metal vias contacts one of the first lateral extension portions. The second line level structure includes a second array of second metal pads, and a second lateral extension portion protrudes from each of the second metal pads, and each of the lateral extension portion contacts one of the first metal vias. A second metal pad vertically overlying a first metal pad is electrically isolated from the first metal pad and is electrically connected to another first metal pad that does not directly underlie the second metal pad.

According to another embodiment of the present invention, a method of forming a metal interconnect structure is provided. The method includes: forming a first line level structure on a substrate, wherein the first line level structure includes a first array of first metal pads embedded in a first dielectric layer, and a first lateral extension portion protrudes from each of the first metal pads; and forming a first via level structure and a second line level structure on the first line level structure, wherein the first via level structure includes first metal vias embedded in a second dielectric layer, each of the first metal vias contacts one of the first lateral extension portions, the second line level structure includes a second array of second metal pads embedded in the second dielectric layer, a second lateral extension portion protrudes from each of the second metal pads, each of the lateral extension portion contacts one of the first metal vias, and a second metal pad vertically overlying a first metal pad is electrically isolated from the first metal pad and is electrically connected to another first metal pad that does not directly underlie the second metal pad.

According to yet another embodiment of the present invention, a lithographic mask set is provided, which includes a first line level mask, a first via level mask, and a second line level mask. The first line level mask includes a first opaque patterned structure located on a first transparent substrate and defining a first pattern. The first pattern includes a first array of first pad shapes and first lateral extension portion shapes. Each of the first lateral extension portion shapes protrudes from one of the first pad shapes. The first via level mask includes a second opaque patterned structure located on a second transparent substrate and defining a second pattern. The second pattern including first via shapes that, upon overlay of the second pattern with the first pattern, are located within areas of the first lateral extension portion shapes. The second line level mask includes a third opaque patterned structure located on a third transparent substrate and defining a third pattern. The third pattern includes a second array of second pad shapes and second lateral extension shapes. Each of the second lateral extension shapes protrudes from one of the second pad shapes. Areas of second lateral extension shapes, upon overlay of the third pattern with the second pattern, include areas of the first via shapes. Upon overlay of the third pattern with the first pattern, overlap areas between the third pattern and the first pattern do not include any area of the first pad shapes or the second pad shapes

DETAILED DESCRIPTION

Figure 1:
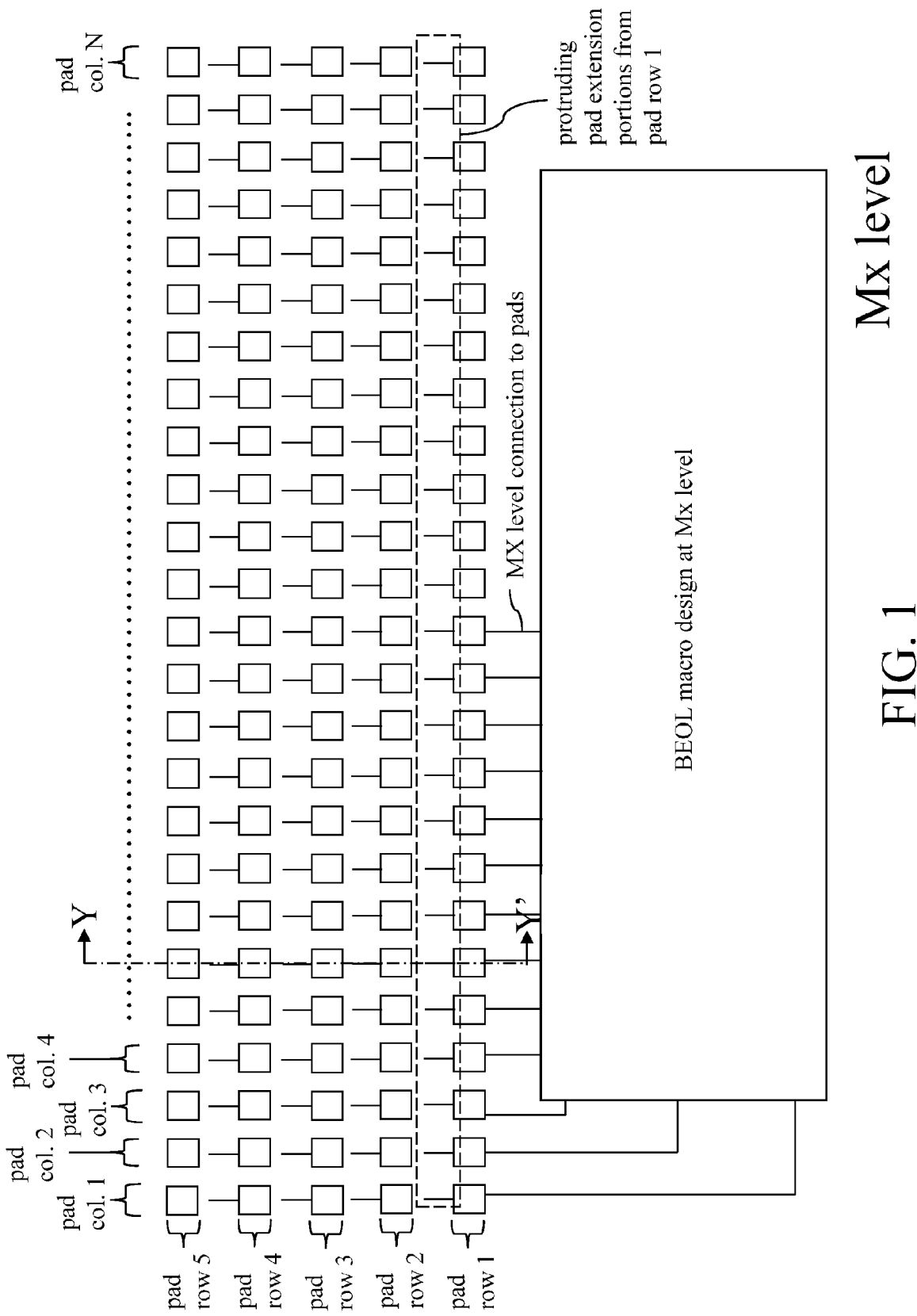
FIG. 1 is a top-down view of a first line level mask at Mx level in an exemplary set of lithographic masks according to a first embodiment of the present invention.

As stated above, the present invention relates to a metal interconnect structure including a test pad structure that enables access to test structures at various levels by repeated use of a same mask set, methods of forming the same, and a mask set for effecting the manufacture of the same, which are described herein with accompanying figures. Throughout the drawings, the same reference numerals or letters are used to designate like or equivalent elements. The drawings are not necessarily drawn to scale.

As used herein, a structural element is referred to as being "on" another structural element when the structural element is located directly on the other structural element or when a set of at least one intervening element making direct physical contact with the structural element and the other structural element is present. A structural element is referred to as being "directly on" another structural element when there is no intervening structural element and a physical contact is formed between the structural element and the other structural element. An element "abuts" another element when a physical interface area providing a direct contact is present between the element and the other element.

As used herein, a "vertical" direction refers to the direction that is normal to the plane of planarization of a metal interconnect structure.

As used herein, a "vertical see-though top-down view" is a view in which the interior and the exterior of any shape are considered to be transparent and in which the direction of the view is vertical.

As used herein, a first element "directly overlies" or "directly underlies" a second element if the shapes of the first element and the second element coincide with each other in a vertical see-through top-down view.

As used herein, a first element is "electrically connected" to a second element if there exists an electrically conductive path to enable flow of electrical current between the first element and the second element.

As used herein, "overlay" refers to an operation in which the image of a first mask or the complement of the image of the first mask is compared with an image of a second mask or the complement of the image of the second mask for the purpose of comparing patterns in the two masks. The overlay may be performed by direct comparison of the first and second masks or by comparison of a lithographic image of the first mask with a lithographic image of the second mask.

Figure 2:
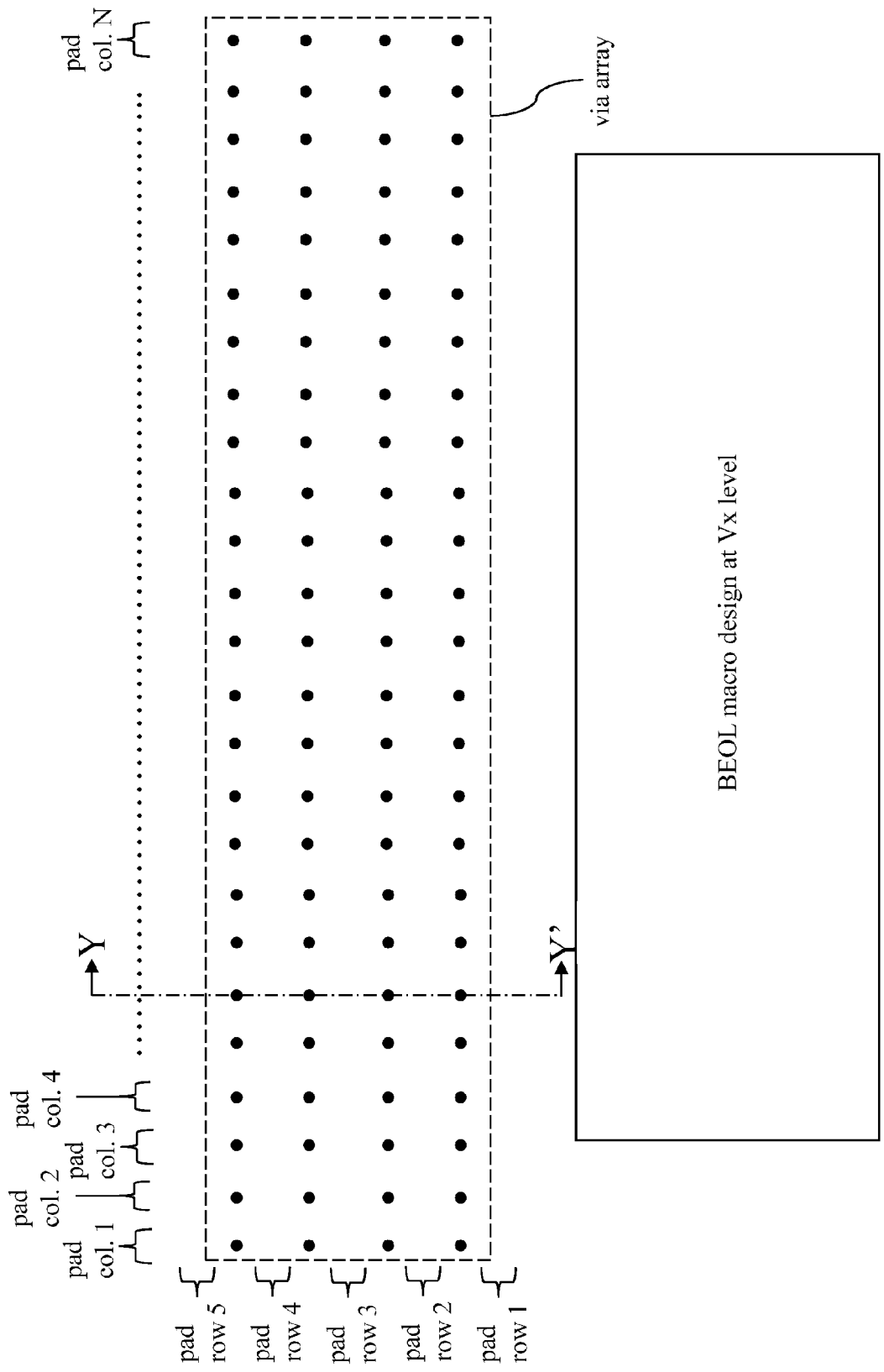
FIG. 2 is a top-down view of a first via level mask at Vx level in the exemplary set of lithographic masks according to the first embodiment of the present invention.
Figure 3:
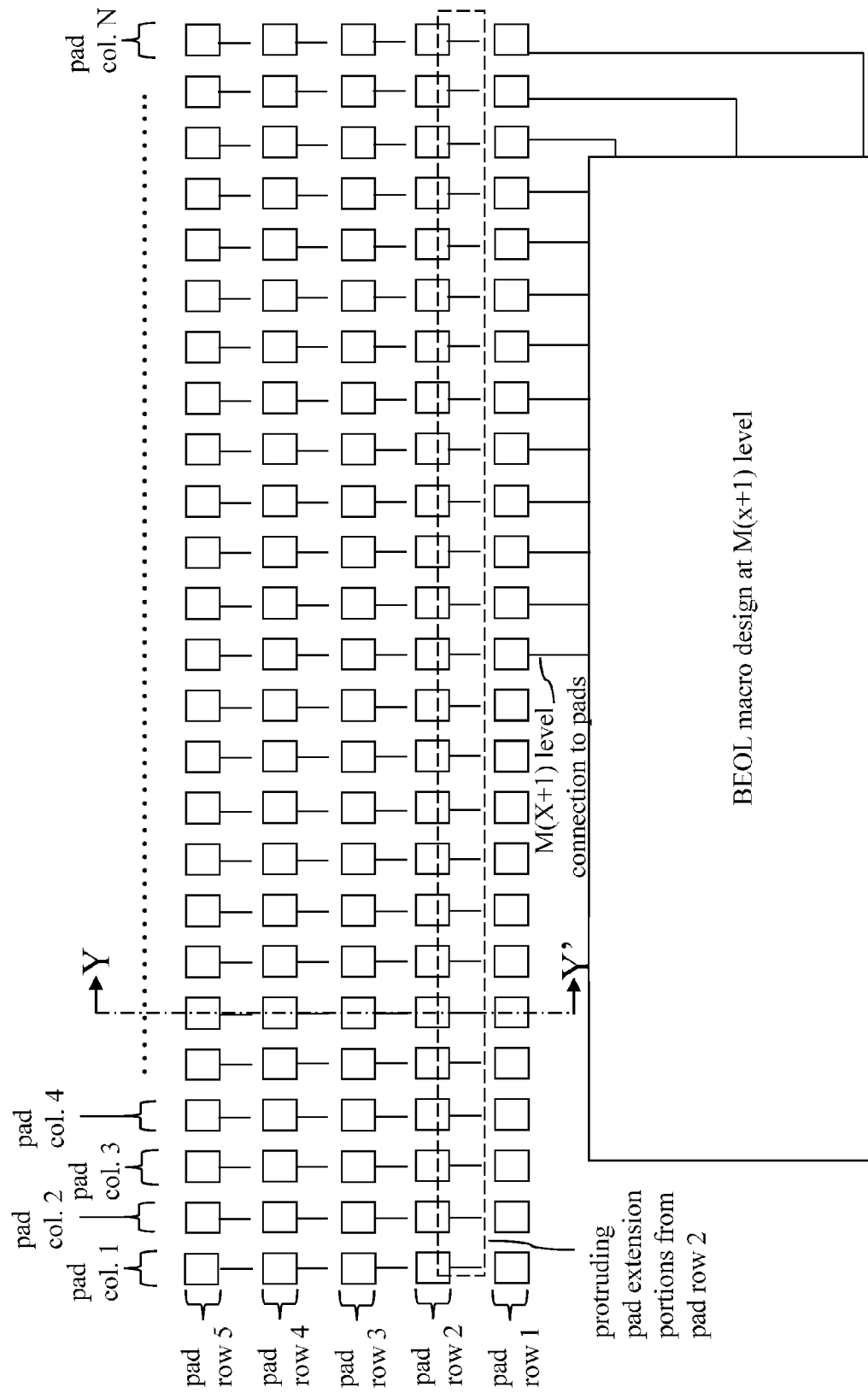
FIG. 3 is a top-down view of a second line level mask at M(x+1) level in the exemplary set of lithographic masks according to the first embodiment of the present invention.
Figure 4:
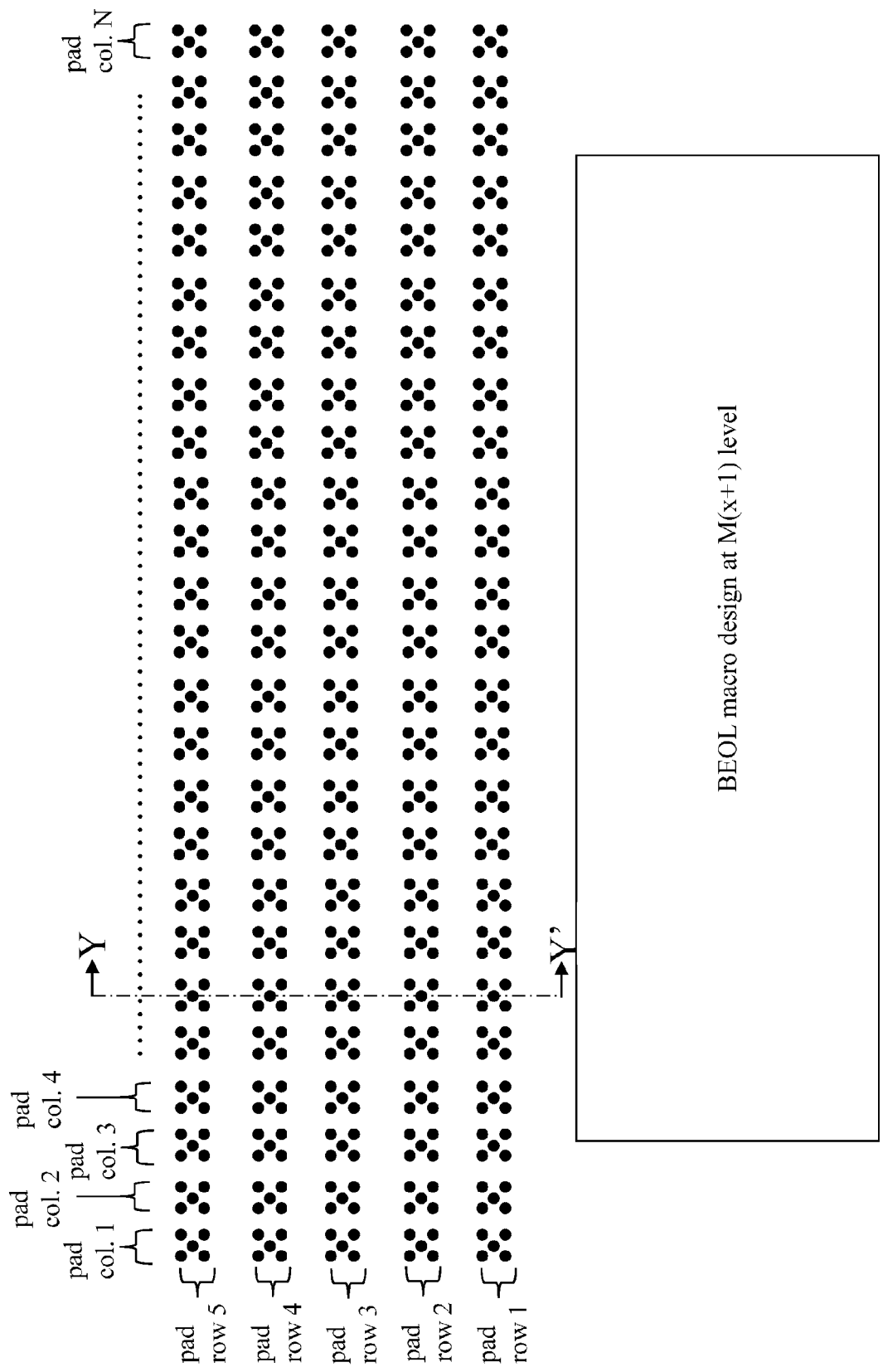
FIG. 4 is a top-down view of a second via level mask at V(x+1) level in the exemplary set of lithographic masks according to the first embodiment of the present invention.
Figure 5:
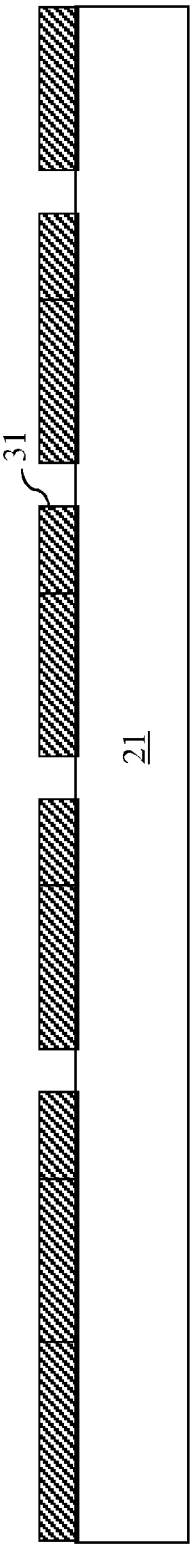
FIG. 5 is a vertical cross-sectional view of the first line level mask at Mx level along the plane Y-Y' in FIG. 1 according to the first embodiment of the present invention.
Figure 6:
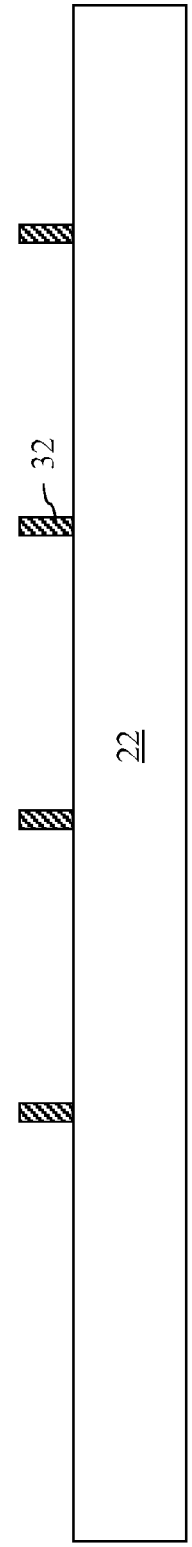
FIG. 6 is a vertical cross-sectional view of the first via level mask at Vx level along the plane Y-Y' in FIG. 2 according to the first embodiment of the present invention.
Figure 7:
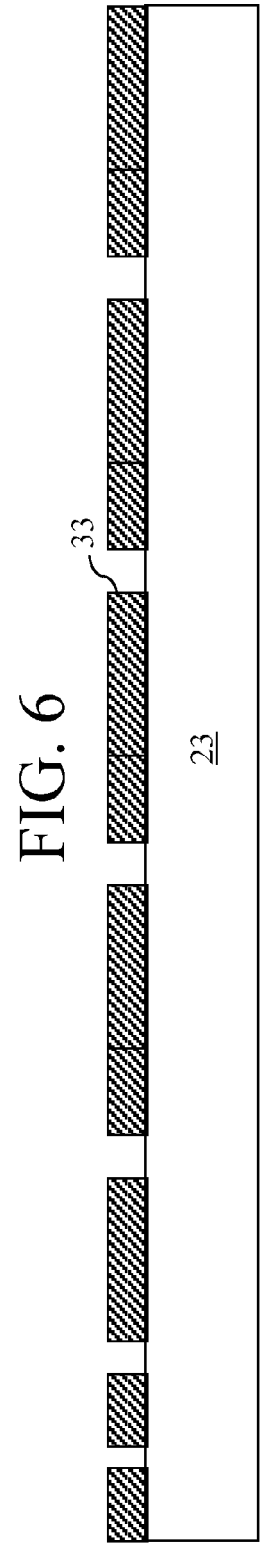
FIG. 7 is a vertical cross-sectional view of the second line level mask at M(x+1) level along the plane Y-Y' in FIG. 1 according to the first embodiment of the present invention.
Figure 8:
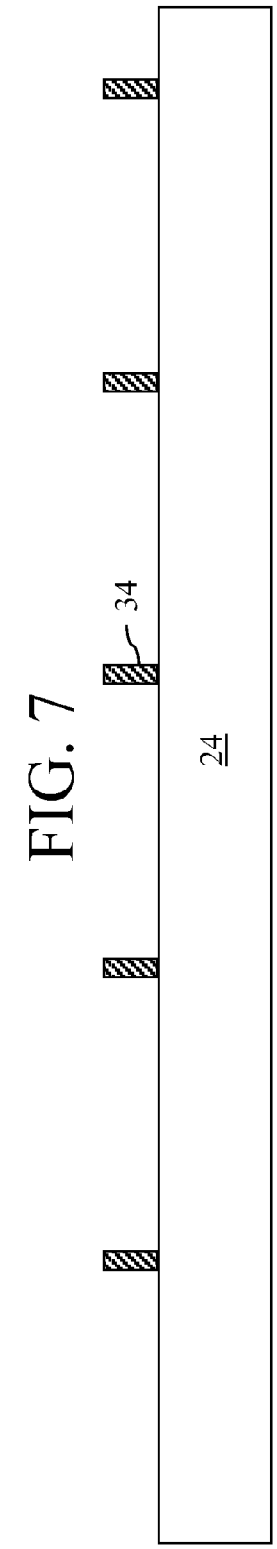
FIG. 8 is a vertical cross-sectional view of the second via level mask at V(x+1) level along the plane Y-Y' in FIG. 2 according to the first embodiment of the present invention.

Referring to FIGS. 1-8, an exemplary set of lithographic masks according to a first embodiment of the present invention includes a first line level mask shown in FIGS. 1 and 5, a first via level mask shown in FIGS. 2 and 6, a second line level mask shown in FIGS. 3 and 7, and a second via level mask shown in FIGS. 4 and 8. The first line level is herein referred to as an Mx level, the first via level is herein referred to as a Vx level, the second line level is herein referred to as a M(x+1) level, and the second via level is herein referred to as a V(x+1) level. The Mx level, the Vx level, the M(x+1) level, and the V(x+1) level can be four vertically consecutive levels to be built as a portion of a metal interconnect structure.

The first line level mask includes a first opaque patterned structure 31 located on a first transparent substrate 21. The first via level mask includes a second opaque patterned structure 32 located on a second transparent substrate 22. The second line level mask includes a third opaque patterned structure 33 located on a third transparent substrate 23. The second via level mask includes a fourth opaque patterned structure 34 located on a fourth transparent substrate 24.

The first opaque patterned structure 31 defines a first pattern that includes a first array of first pad shapes and first lateral extension portion shapes. Each of the first lateral extension portion shapes protrudes from one of the first pad shapes. The first array of the first pad shapes can define a first two-dimensional array. The first two-dimensional array can have regular spacings in two horizontal directions.

For example, the first two-dimensional array can be a rectangular two-dimensional array including M pad rows and N pad columns. M and N are integers greater than 1. In one embodiment, M can be an integer from 2 to 16, and typically from 2 to 6. In another embodiment, N can be an integer from 10 to 60, and typically from 20 to 40, although lesser and greater numbers can also be employed.

The first array of first pad shapes is configured to enable formation of a first array of first metal pads in a metal interconnect structure as will be explained below. The lithographic image generated from the first line level mask includes an image of the first array of the first pad shapes. The spacing between images of adjacent first pad shapes within the same row can be constant in the lithographic image, and can be from 10 micron to 200 micron, and typically from 60 micron to 100 micron, although lesser and greater spacings can also be employed. The spacing between images of adjacent first pad shapes within the same column (or "col.") can be constant in the lithographic image, and can be from 10 micron to 200 micron, and typically from 60 micron to 100 micron, although lesser and greater spacings can also be employed.

In case the first pad shapes are rectangular shapes, the sides of each image of the first pad shapes can have a lateral dimension from 30 microns to 120 microns, and typically from 60 microns to 90 microns, although lesser and greater dimensions can also be employed. The lateral dimensions of images of the first pad shapes and the spacings between the images of adjacent first pad shapes are selected to enable formation of first metal pads on which a test probe of a tester can land. Typically, the test probe includes a one-dimensional array of pins that land on test pads of a single row. The shape of each first metal pad embedded in a metal interconnect structure can be in general polygonal, elliptical, or any closed shape having at least one area large enough to accommodate the landing of the pins on a test probe.

The first pattern can further include the first line level portions of a back-end-of-line (BEOL) macro design, i.e., all components of the BEOL macro design that are located in the first line level. For example, the BEOL macro design can include, but is not limited to, at least one comb structure and/or at least one serpentine structure that is/are configured to test leakage of a dielectric material in the first line level or the electrical continuity of lines within the first line level. The first pattern can further include first metal line shapes that are contiguously connected to two of the first pad shapes. The first metal line shapes constitute patterns for physically constructing connection structures in the form of metal lines in a metal interconnect structure. The patterns for connection structures are located between patterns for the BEOL macro design and the patterns for the first pad shapes in the first row, or "pad row 1," within the first array of first pad shapes.

While the first lateral extension portion shapes in the first pattern are represented as lines in FIG. 1, each of the first lateral extension portion shapes are two-dimensional shapes having a finite length and a finite width on the first line level mask. Upon lithographic printing, the first lateral extension portion shapes in the first pattern are replicated as patterns in a photoresist, and are subsequently replicated as conductive metal lines in a dielectric material layer at the Mx level in a metal interconnect structure. Likewise, the patterns for connection structures represented as lines in FIG. 1 are also replicated as additional conductive metal lines. The Mx level features in the BEOL macro design are also replicated as conductive metal lines in the Mx level within the metal interconnect structure.

Each first lateral extension portion shapes extends from one of the first pad shapes, but does not extend to any other first pad shape. In one embodiment, the length of each first lateral extension portion shapes is less than the spacing between adjacent first pad shapes on the first metal level mask.

The second opaque patterned structure 32 on the first via level mask defines a second pattern that includes first via shapes. Upon overlay of the second pattern with the first pattern either through direct comparison of the first line level mask with the first via level mask or by an indirect comparison of a lithographic pattern from the first line level mask with a lithographic pattern from the first via level mask, each of the first via shapes is located within areas of the first lateral extension portions shapes. During the overlay, each feature in the second pattern is aligned to a feature in the first pattern whenever a physical structure embodying the feature in the second pattern is intended to physically directly overlie a physical structure embodying the feature in the first pattern.

The third opaque patterned structure 33 on the second line level mask defines a third pattern. The third pattern includes a second array of second pad shapes and second lateral extension shapes. Each of the second lateral extension shapes protrudes from one of the second pad shapes. Upon overlay of the third pattern with the second pattern, areas of second lateral extension shapes include areas of the first via shapes. Upon overlay of the third pattern with the first pattern, overlap areas between the third pattern and the first pattern do not include any area of the first pad shapes or the second pad shapes. However, upon overlay of the first pattern, the second pattern, and the third pattern, overlap areas between the third pattern and the first pattern include all areas of the first via shapes.

The second array of the second pad shapes can define a second two-dimensional array. The second two-dimensional array can have regular spacings in two horizontal directions. Upon overlay of the third pattern with the first pattern, the second two-dimensional array can be congruent with the first two-dimensional array. For example, the second two-dimensional array can be a rectangular two-dimensional array including M pad rows and N pad columns in which the number M matches the number of the rows in the first array and the number N matches the number of the columns in the first array.

The second array of the second pad shapes is configured to enable formation of a second array of second metal pads in the metal interconnect structure in which the first array of the first metal pads is formed. The lithographic image generated from the second line level mask includes an image of the second array of the second pad shapes. The spacing between images of adjacent second pad shapes within the same row can be constant in the lithographic image, and can be from 10 micron to 200 micron, and typically from 60 micron to 100 micron, although lesser and greater spacings can also be employed. The spacing between images of adjacent second pad shapes within the same column (or "col.") can be constant in the lithographic image, and can be from 10 micron to 200 micron, and typically from 60 micron to 100 micron, although lesser and greater spacings can also be employed.

In case the second pad shapes are rectangular shapes, the sides of each image of the second pad shapes can have a lateral dimension from 30 microns to 120 microns, and typically from 60 microns to 90 microns, although lesser and greater dimensions can also be employed. The lateral dimensions of the images of the second pad shapes and the spacings between the images of adjacent second pad shapes are selected to enable formation of second metal pads on which a test probe of a tester can land. The shape of each second metal pad embedded in a metal interconnect structure can be in general polygonal, elliptical, or any closed shape having at least one area large enough to accommodate the landing of the pins on a test probe.

The second pattern can further include the second line level portions of the back-end-of-line (BEOL) macro design, i.e., all components of the BEOL macro design that are located in the second line level. The second pattern can further include second metal line shapes that are contiguously connected to two of the second pad shapes. The second metal line shapes constitute patterns for physically constructing connection structures in the form of metal lines in a metal interconnect structure. The patterns for connection structures are located between patterns for the BEOL macro design and the patterns for the second pad shapes in the first row within the second array of the second pad shapes.

While the second lateral extension portion shapes in the second pattern are represented as lines in FIG. 3, each of the second lateral extension portion shapes are two-dimensional shapes having a finite length and a finite width on the second line level mask. Upon lithographic printing, the second lateral extension portion shapes in the second pattern are replicated as patterns in a photoresist, and are subsequently replicated as conductive metal lines in a dielectric material layer at the M(x+1) level in the metal interconnect structure Likewise, the patterns for connection structures represented as lines in FIG. 3 are also replicated as additional conductive metal lines. The M(x+1) level features in the BEOL macro design are also replicated as conductive metal lines in the M(x+1) level within the metal interconnect structure.

Each second lateral extension portion shapes extends from one of the second pad shapes, but does not extend to any other second pad shape. In one embodiment, the length of each second lateral extension portion shapes is less than the spacing between adjacent second pad shapes on the second metal level mask.

The fourth opaque patterned structure 34 on the fourth transparent substrate 24 defines a fourth pattern. The fourth pattern includes second via shapes that, upon overlay of the fourth pattern with the third pattern, are located within the areas of the second pad shapes in the third pattern.

Each of the first line level mask, the first via level mask, the second line level mask, and the second via level mask can be a positive mask or a negative mask. In other words, the first pattern can be defined by the area of the first opaque patterned structure 31 or by the complement of the area of the first opaque patterned structure 31. The second pattern can be defined by the area of the second opaque patterned structure 32 or by the complement of the area of the second opaque patterned structure 32. The third pattern can be defined by the area of the third opaque patterned structure 33 or by the complement of the area of the third opaque patterned structure 33. The fourth pattern can be defined by the area of the fourth opaque patterned structure 34 or by the complement of the area of the fourth opaque patterned structure 34.

X can be any positive integer. Thus, the set of the first line level mask, the first via level mask, the second line level mask, and the second via level mask constitute four masks that can be employed to define patterns for any two adjacent metal levels, the via level located between the two adjacent metal levels, and the via level located directly above the upper level of the two adjacent metal levels. For example, if X=1, the four masks include an M1 mask, a V1 mask, an M2 mask, and a V2 mask. If X=2, the four masks include an M2 mask, a V2 mask, an M3 mask, and a V3 mask. The same type of labeling scheme applies to any integer X greater than 2.

Figure 9:
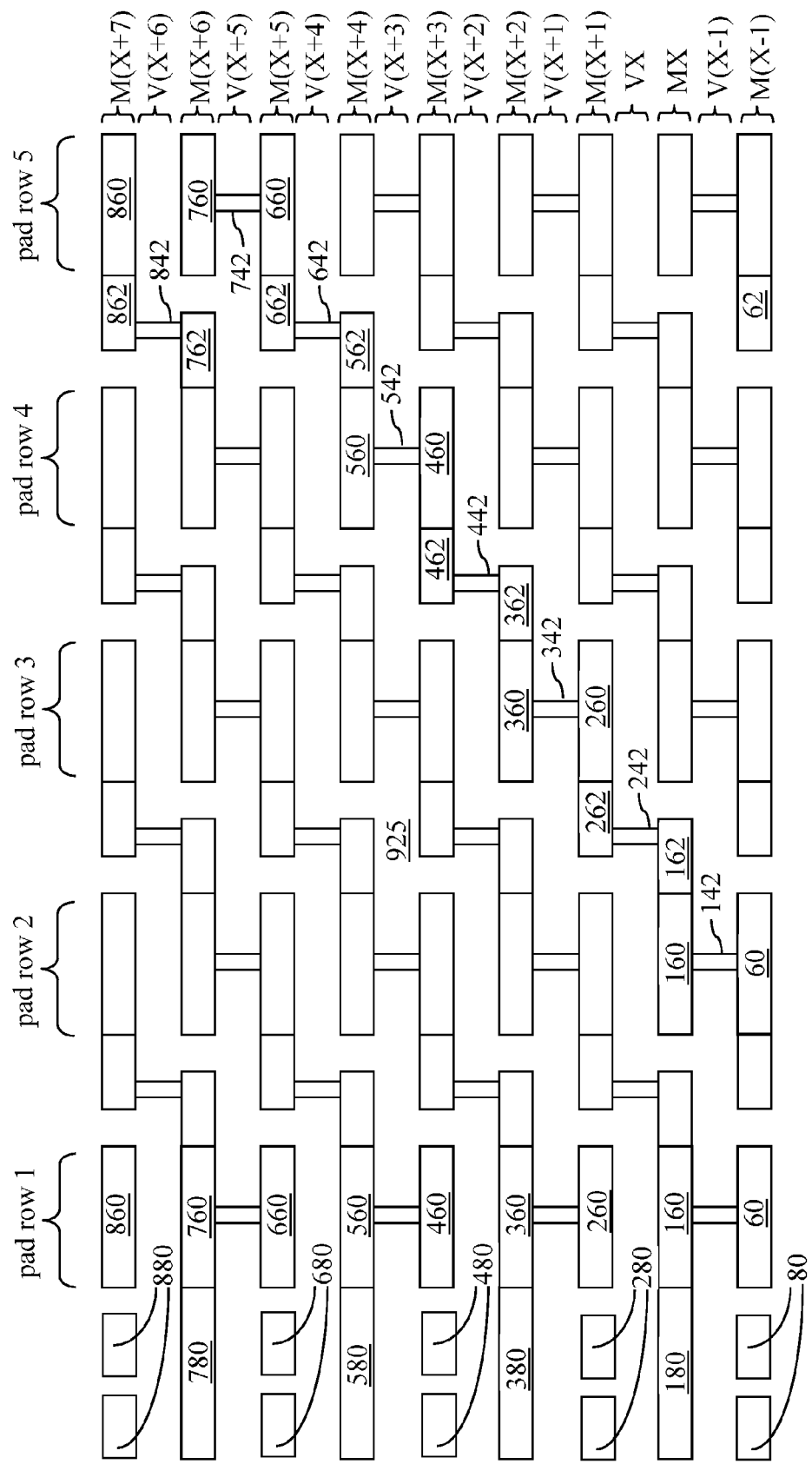
FIG. 9 is a vertical cross-sectional view of a first exemplary metal interconnect structure according to a second embodiment of the present invention.

Referring to FIG. 9, the exemplary set of lithographic masks of FIGS. 1-8 can be employed to form a first exemplary metal interconnect structure according to a second embodiment of the present invention. The exemplary set of lithographic masks of FIGS. 1-8 are repeatedly employed to form a vertically replicating pattern in the first exemplary metal interconnect structure. The first exemplary metal interconnect structure includes at least one dielectric layer 925 embedding various conductive structures, which can be metal structures.

The first exemplary metal interconnect structure includes at least a first line level structure, a first via level structure, and a second line level structure. The first line level structure is represented as structures in the Mx level, the first via level structure is represented as structures in the Vx level, and the second line level structure is represented as structures in the M(x+1) level. Specifically, the first exemplary metal interconnect structure includes, from bottom to top, the first line level structure, the first via level structure, and the second line level structure.

The first line level structure includes a first array of first metal pads 160 located within the Mx level. The first line level structure in FIG. 9 has the same pattern as a lithographic image of the first pattern in the first line level mask of FIGS. 1 and 5. As such, a first lateral extension portion 162 protrudes from each of the first metal pads. The first line level structure can be formed by forming trenches in one of the at least one dielectric layer 925 by lithographic means employing the first line level mask having the first pattern. The pattern in the first line level structure is a replica of the first pattern in the first line level mask such that the replica is related to the first pattern by the image reduction factor of a lithography tool. The image reduction factor is typically from 4 to 5.

The first line level, i.e., the Mx level, can further include a first line level test structure 180, which includes metallic structures located in a same level as the first line level structure. The first line level test structure 180 can include first metal lines that are electrically connected to two of the first metal pads 160.

The first via level structure includes first metal vias 242 located within the Vx level. The first via level structure has the same pattern as a lithographic image of the second pattern in the first via level mask of FIGS. 2 and 6. As such, each of the first metal vias 242 contacts one of the first lateral extension portions 162. The first via level structure can be formed by forming via holes in one of the at least one dielectric layer 925 by lithographic means employing the first via level mask having the second pattern. The pattern in the first via level structure is a replica of the second pattern in the first via level mask such that the replica is related to the second pattern by the image reduction factor of a lithography tool.

The second line level structure includes a second array of second metal pads 260 located within the M(x+1) level. A second lateral extension portion 262 protrudes from each of the second metal pads 260. Each of the lateral extension portion 252 contacts one of the first metal vias 242. A second metal pad 260 vertically overlying a first metal pad 160 is electrically isolated from the first metal pad 160 and is electrically connected to another first metal pad 160 that does not directly underlie the second metal pad 260. The second line level structure can be formed by forming trenches in one of the at least one dielectric layer 925 by lithographic means employing the second line level mask having the third pattern. The pattern in the second line level structure is a replica of the third pattern in the second line level mask such that the replica is related to the third pattern by the image reduction factor of a lithography tool.

The second line level, i.e., the M(x+1) level, can further include a second line level test structure 280, which includes metallic structures located in a same level as the first line level structure. The second line level test structure 280 can include second metal lines that are electrically connected to two of the second metal pads 260.

The first array of the first metal pads 160 and the second array of the second metal pads 260 can be two-dimensional arrays with regular spacing in two horizontal directions. Further, the second line level structure can be so patterned that each second metal pad 260 in the second array directly overlies a first metal pad 160 in the first array.

The first exemplary metal interconnect structure can further include a second via level structure located within the V(x+1) level. The second via level structure includes second metal vias 342, and is located above the second line level structure. Each of the second metal vias 342 contacts an upper surface of one of the second metal pads 260 and does not contact any of the second lateral extension portions 262. The second via level structure can be formed by forming via holes in one of the at least one dielectric layer 925 by lithographic means employing the second via level mask having the fourth pattern. The pattern in the second via level structure is a replica of the fourth pattern in the second via level mask such that the replica is related to the second pattern by the image reduction factor of a lithography tool.

The first exemplary metal interconnect structure can further include a third line level structure, which includes a third array of third metal pads 360 located within the M(x+2) level. A third lateral extension portion 362 protrudes from each of the third metal pads 260. Each of the third lateral extension portions 362 directly overlies one of the first lateral extension portions 162 and each of the third metal pads 360 directly overlies one of the first metal pads 160.

The third line level structure can be formed by forming trenches in one of the at least one dielectric layer 925 by lithographic means employing the first line level mask having the first pattern. Thus, the first line level mask is reused to form the third line level structure. The pattern in the third line level structure is a replica of the first pattern in the first line level mask such that the replica is related to the first pattern by the image reduction factor of a lithography tool.

Because the first line level mask is used to form both the first line level structure and the third line level structure, each two-dimensional shape of any structures within the level of the third line level structures, i.e., within the M(x+2) level, directly overlies a congruent two-dimensional shape of a structure within the level of the first line level structures, i.e., the Mx level.

The third line level, i.e., the M(x+2) level, can further include a third line level test structure 380, which includes metallic structures located in a same level as the third line level structure. The third line level test structure 380 can include third metal lines that are electrically connected to two of the third metal pads 360.

The first exemplary metal interconnect structure can further include a third via level structure including third metal vias 442 within the V(x+2) level. Each of the third metal vias 442 contacts one of the third lateral extension portions 362. Each of the third metal vias 442 directly overlies one of the first metal vias 242. Specifically, each two-dimensional shape of any structures within the level of the third via level structures, i.e., within the V(x+2) level, directly overlies a congruent two-dimensional shape of a structure within the level of the first via level structures, i.e., within the Vx level.

The third via level structure can be formed by forming via holes in one of the at least one dielectric layer 925 by lithographic means employing the first via level mask having the second pattern. Thus, the first via level mask is reused to form the third via level structure. The pattern in the third via level structure is a replica of the second pattern in the first via level mask such that the replica is related to the first pattern by the image reduction factor of a lithography tool.

The reuse of the four lithographic masks, i.e., the first line level mask of FIGS. 1 and 5, the first via level mask of FIGS. 2 and 6, the second line level mask of FIGS. 3 and 7, and the second via level mask of FIGS. 4 and 8, can be repeated to build additional levels. For example, the additional levels can include a fourth line level test structure 480 and a fourth line level structure that are located in the M(x+3) level and including a fourth array of fourth metal pads 460 and fourth lateral extension portions 462, a fourth via level structure located in the V(x+3) level and including fourth metal vias 542, a fifth line level test structure 580 and a fifth line level structure that are located in the M(x+4) level and including a fifth array of fifth metal pads 560 and fifth lateral extension portions 562, a fifth via level structure located in the V(x+4) level and including fifth metal vias 642, a sixth line level test structure 680 and a sixth line level structure that are located in the M(x+5) level and including a six array of sixth metal pads 660 and sixth lateral extension portions 662, a sixth via level structure located in the V(x+5) level and including sixth metal vias 742, a seventh line level test structure 780 and a seventh line level structure that are located in the M(x+6) level and including a seventh array of seventh metal pads 760 and seventh lateral extension portions 762, a seventh via level structure located in the V(x+6) level and including seventh metal vias 842, an eighth line level test structure 880 and an eighth line level structure that are located in the M(x+7) level and including an eighth array of eighth metal pads 860 and eighth lateral extension portions 862, and so on.

It is understood that the first exemplary metal interconnect structure can be terminated at any level without any need to build all of the levels described herein. Further, it is understood that repeated use of the four mask sets can be extended to levels located below the first line level structure. For example, underlying metal vias 142 in the V(x−1) level can be provided underneath the structures in the Mx level, and an underlying array of underlying metal pads 60 and underlying lateral extension portions 62 can be formed within an underlying line level structure in the M(x−1) level, which is located underneath the V(x−1) level.

The at least one dielectric material layer 925 that embeds the first line level structure, the first via level structure, the second line level structure, etc. can be located on at least one semiconductor device on a semiconductor substrate.

Figure 10:
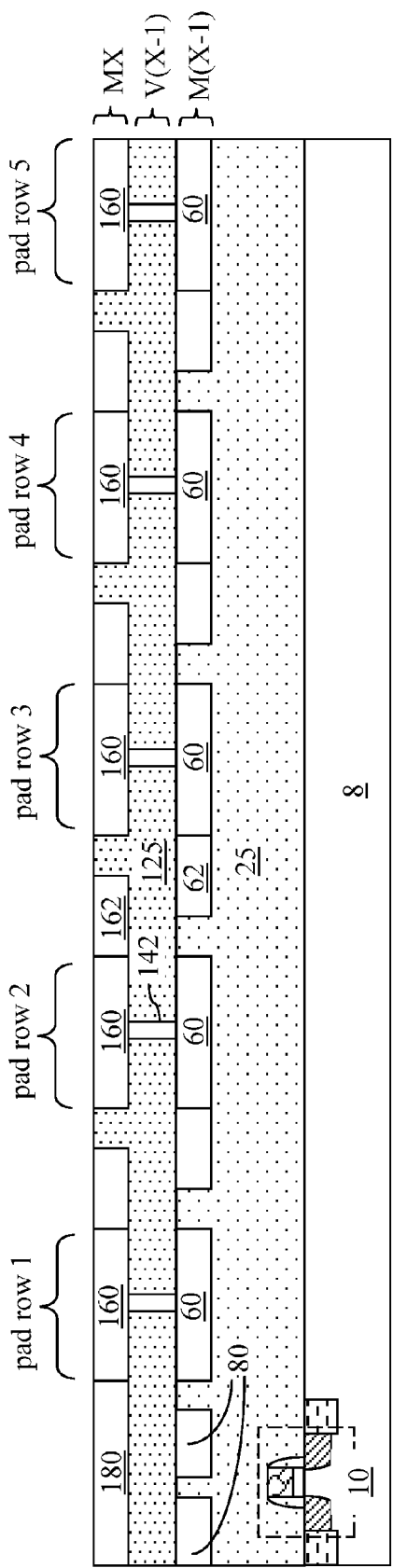
FIG. 10 is a vertical cross-sectional view of an exemplary semiconductor structure after formation of Mx level structures according to a third embodiment of the present invention.

Referring to FIG. 10, an exemplary semiconductor structure includes a semiconductor substrate 8, at least one semiconductor device 10 located on the semiconductor substrate 10, at least one optional underlying dielectric layer 25, and a first dielectric layer 125. An optional underlying array of underlying metal pads 60, optional underlying lateral extension portions 62, and an optional underlying line level test structure 80, if present, can be embedded in the at least one underlying dielectric layer 25. A first array of first metal pads 160, first lateral extension portions 162, a first line level test structure 180 and optional underlying metal vias 142 can be embedded in the first dielectric layer 125. The at least one underlying dielectric layer 25 and the first dielectric layer 125 collectively correspond to a portion of the at least one dielectric layer 925 in FIG. 9.

To manufacture the exemplary semiconductor structure, the at least one semiconductor device 10 is formed on the semiconductor substrate 10 employing methods known in the art. The at least one underlying dielectric layer 25 and any contact structures (not shown) to the at least one semiconductor device 10 are formed on the at least one semiconductor device 10. Subsequently, the optional line level structure including the optional underlying array of the underlying metal pads 60 can be formed within the optional at least one dielectric layer 25. Further, the optional underlying line level test structure 80 can be formed as an embedded structure within the at least one underlying dielectric layer 25. The at least one underlying dielectric layer can include a plurality of metal line levels and metal via levels that include conductive structures that are electrically connected to the at least one semiconductor device 10.

Subsequently, a first dielectric layer 125 is deposited over the optional at least one dielectric layer 25. The underlying metal vias 142 are formed in the lower portion of the first dielectric layer 125 and the first array of the first metal vias 160, the first lateral extension portions 162, and the first line level test structure 180 are formed in the upper portion of the first dielectric layer 125. The pattern in the collection of the first array of the first metal pads 160, the first lateral extension portions 162, and the first line level test structure 180 is a replica of the first pattern in the first line level mask of FIGS. 1 and 5. The first array of the first metal pads 160 can be formed as a two-dimensional array as described above. The first dielectric layer 125 can have a homogeneous composition, or can have a plurality of layers comprising different dielectric materials. The first dielectric layer 125 embeds structures in the V(x−1) level and the Mx level.

The optional at least one dielectric layer 25 and/or the first dielectric material layer 125 may comprise an oxide based dielectric material, which has a dielectric constant k from 3.6 to 3.9, or a low-k dielectric material, which has a dielectric constant k of 3.0 or less, preferably less than 2.8, and more preferably less than 2.5. Non-limiting examples of the oxide based dielectric material include undoped silicate glass (USG), fluorosilicate glass (FSG), borophosphosilicate glass (BPSG), and phosphosilicate glass (PSG). The low-k dielectric material may be a spin-on low-k dielectric material or a CVD low-k dielectric material, i.e., a low-k dielectric material deposited by chemical vapor deposition (CVD). An example of the spin-on low-k dielectric material is a thermosetting polyarylene ether, which is also commonly referred to as "Silicon Low-K", or "SiLK™." The term "polyarylene" herein denotes aryl moieties or inertly substituted aryl moieties which are linked together by bonds, fused rings, or inert linking groups such as oxygen, sulfur, sulfone, sulfoxide, carbonyl, etc. Composition and deposition methods of the CVD low-k dielectric material are well known in the art. For example, the CVD low-k dielectric material may be a SiCOH dielectric containing a matrix of a hydrogenated oxidized silicon carbon material (SiCOH) comprising atoms of Si, C, O and H in a covalently bonded tri-dimensional network. Both the spin-on low-k dielectric material and the CVD low-k dielectric material may be porous, which decreases the dielectric constant of the optional at least one dielectric layer 25 and/or the first dielectric material layer 125. The optional at least one dielectric layer 25 and/or the first dielectric material layer 125 may comprise a stack of at least two of the oxide based conventional dielectric material, the spin-on low-k dielectric material, and the CVD low-k dielectric material.

Figure 11:
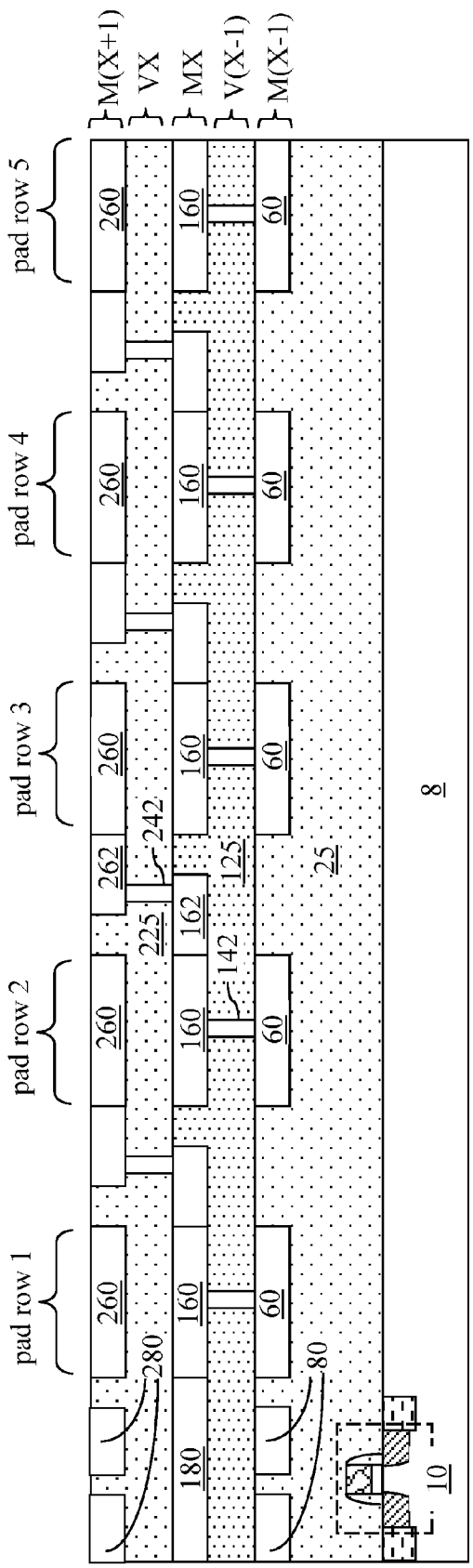
FIG. 11 is a vertical cross-sectional view of the exemplary semiconductor structure after formation of M(x+1) level structures according to a third embodiment of the present invention.

Referring to FIG. 11, a second dielectric layer 225 is deposited over the first dielectric layer 125. The material of the second dielectric layer 225 can be any material that can be employed for the optional at least one dielectric layer 25 or the first dielectric material layer 125. First metal vias 242 are formed in the lower portion of the second dielectric layer 225, and a second array of second metal vias 260, second lateral extension portions 262, and a second line level test structure 280 are formed in the upper portion of the second dielectric layer 225.

The pattern of the first metal vias 242 is a replica of the second pattern in the first via level mask of FIGS. 2 and 6. The pattern in the collection of the second array of the second metal vias 260, the second lateral extension portions 262, and the second line level test structure 280 is a replica of the third pattern in the second line level mask of FIGS. 3 and 7. The second array of the second metal pads 260 can be formed as a two-dimensional array. In one embodiment, the second array of the second metal pads 260 can directly overlie the first array of the first metal pads 160. The second dielectric layer 225 can have a homogeneous composition, or can have a plurality of layers comprising different dielectric materials. The second dielectric layer 225 embeds structures in the Vx level and the M(x+1) level.

Figure 12:
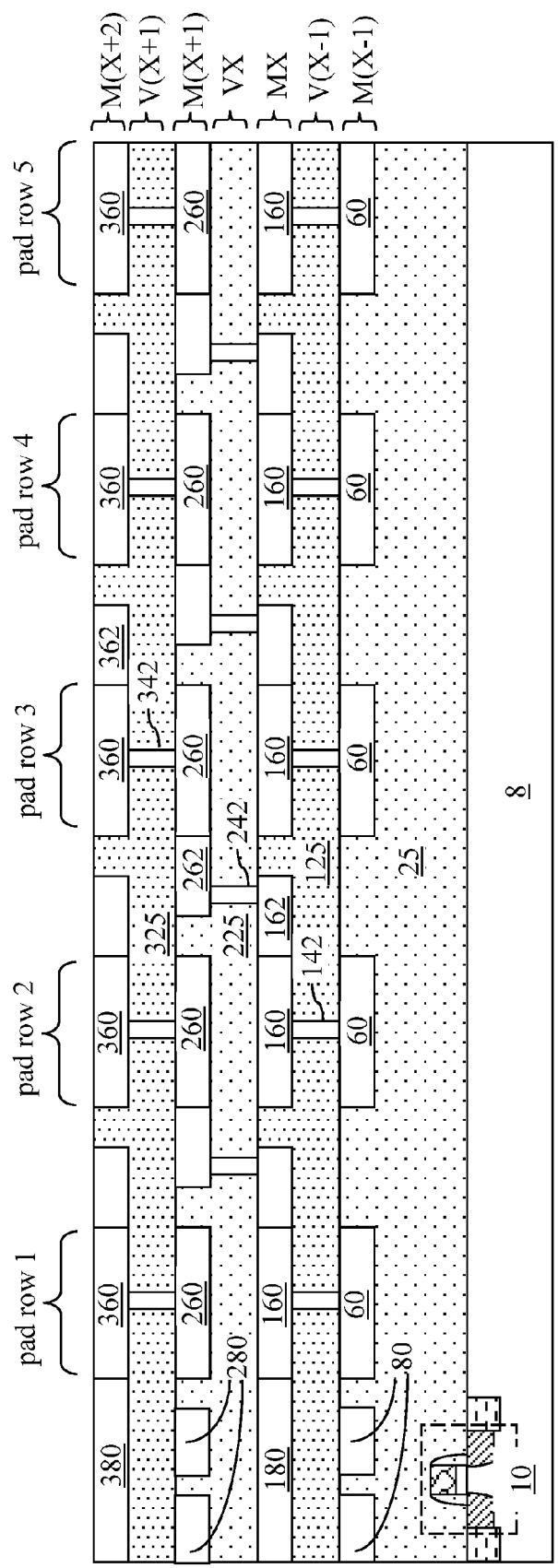
FIG. 12 is a vertical cross-sectional view of the exemplary semiconductor structure after formation of M(x+2) level structures according to a third embodiment of the present invention

Referring to FIG. 12, a third dielectric layer 325 is deposited over the second dielectric layer 225. The material of the third dielectric layer 325 can be any material that can be employed for the optional at least one dielectric layer 25 or the first dielectric material layer 125. Second metal vias 342 are formed in the lower portion of the third dielectric layer 325, and a third array of third metal vias 360, third lateral extension portions 362, and a third line level test structure 380 are formed in the upper portion of the third dielectric layer 325.

The pattern of the second metal vias 342 is a replica of the fourth pattern in the second via level mask of FIGS. 4 and 8. The pattern in the collection of the third array of the third metal vias 360, the third lateral extension portions 362, and the third line level test structure 380 is a replica of the first pattern in the first line level mask of FIGS. 1 and 5. The third array of the third metal pads 360 can be formed as a two-dimensional array. The third array of the third metal pads 360 directly overlies the first array of the first metal pads 160. In one embodiment, the third array of the third metal pads 360 can directly overlie the second array of the second metal pads 260. The third dielectric layer 325 can have a homogeneous composition, or can have a plurality of layers comprising different dielectric materials. The third dielectric layer 325 embeds structures in the V(x+1) level and the M(x+2) level.

The processes of steps corresponding to FIGS. 11 and 12 can be alternately performed employing the four lithographic masks of FIGS. 1-8 to form vertically repeating patterns that coincide at every second metal level or at every second via level. The metal interconnect structure that can be formed above the semiconductor substrate 8 after the step of FIG. 12 can be substantially the same as the structure shown in FIG. 9.

Figure 13:
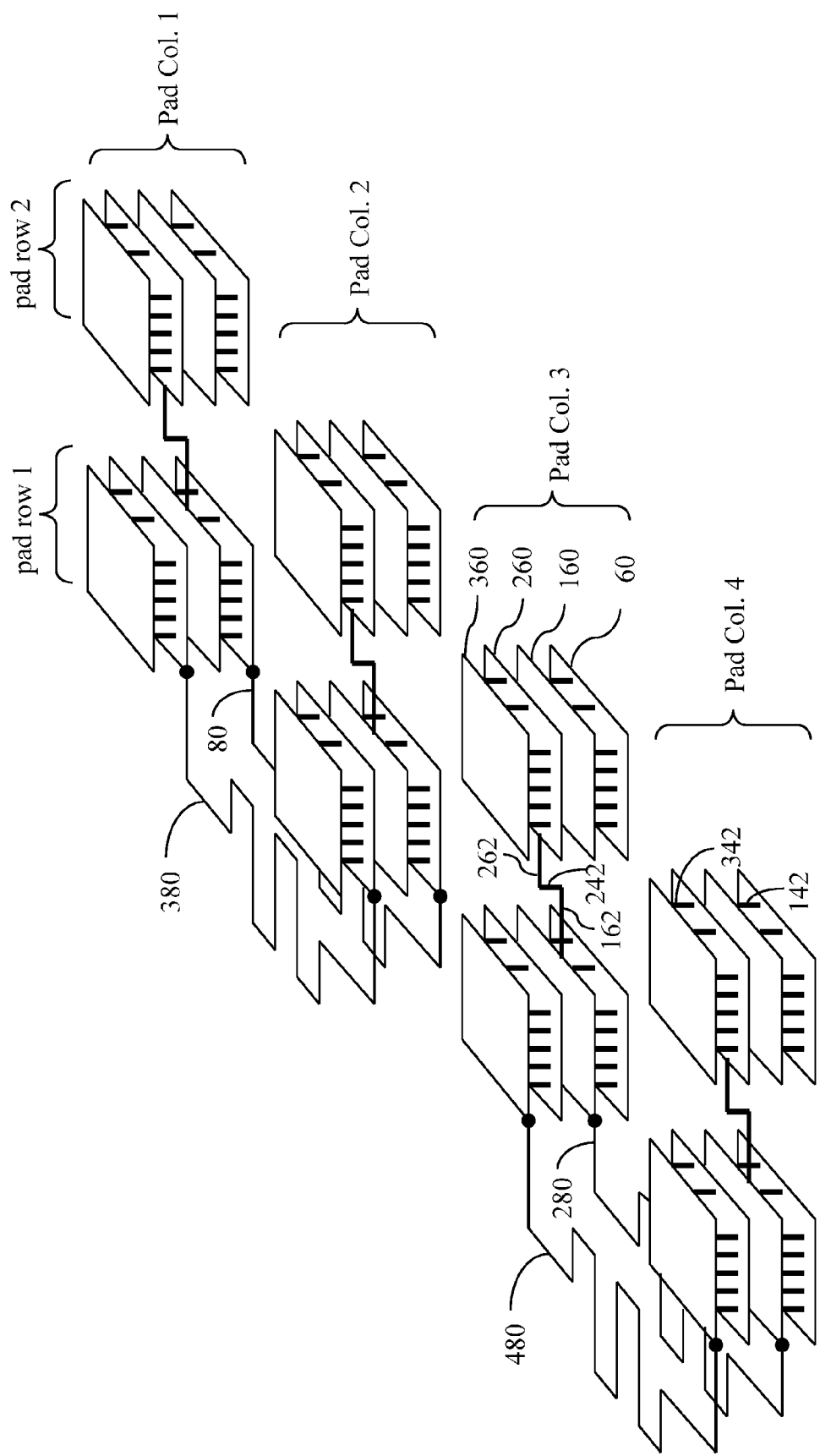
FIG. 13 is a bird's eye view of a second exemplary metal interconnect structure according to a fourth embodiment of the present invention.

Referring to FIG. 13, a bird's eye view of a second exemplary metal interconnect structure according to a fourth embodiment of the present invention exemplifies the types of BEOL macro designs that can be employed for the line level test structures (such as the first line level test structure 180, the second line level test structure 280, the third line level test structure 380, the fourth line level test structures 480, etc. in FIGS. 9-12).

The BEOL macro, which is a physical manifestation of the BEOL macro design resident in the lithographic masks, can include, but is not limited to, at least one comb structure and/or at least one serpentine structure that is/are configured to test leakage of a dielectric material in the first line level or the electrical continuity of lines within the first line level. Each line level test structure can include metal lines that are contiguously connected to two of the metal pads in the same level. The metal lines of the line level test structures are located between the BEOL macro and the metal pads in the first row, i.e., pad row 1. It is understood that the specific electrical connections in the second exemplary metal interconnect structure are for illustration only, and any alternate electrical connection can be employed instead.

Figure 14:
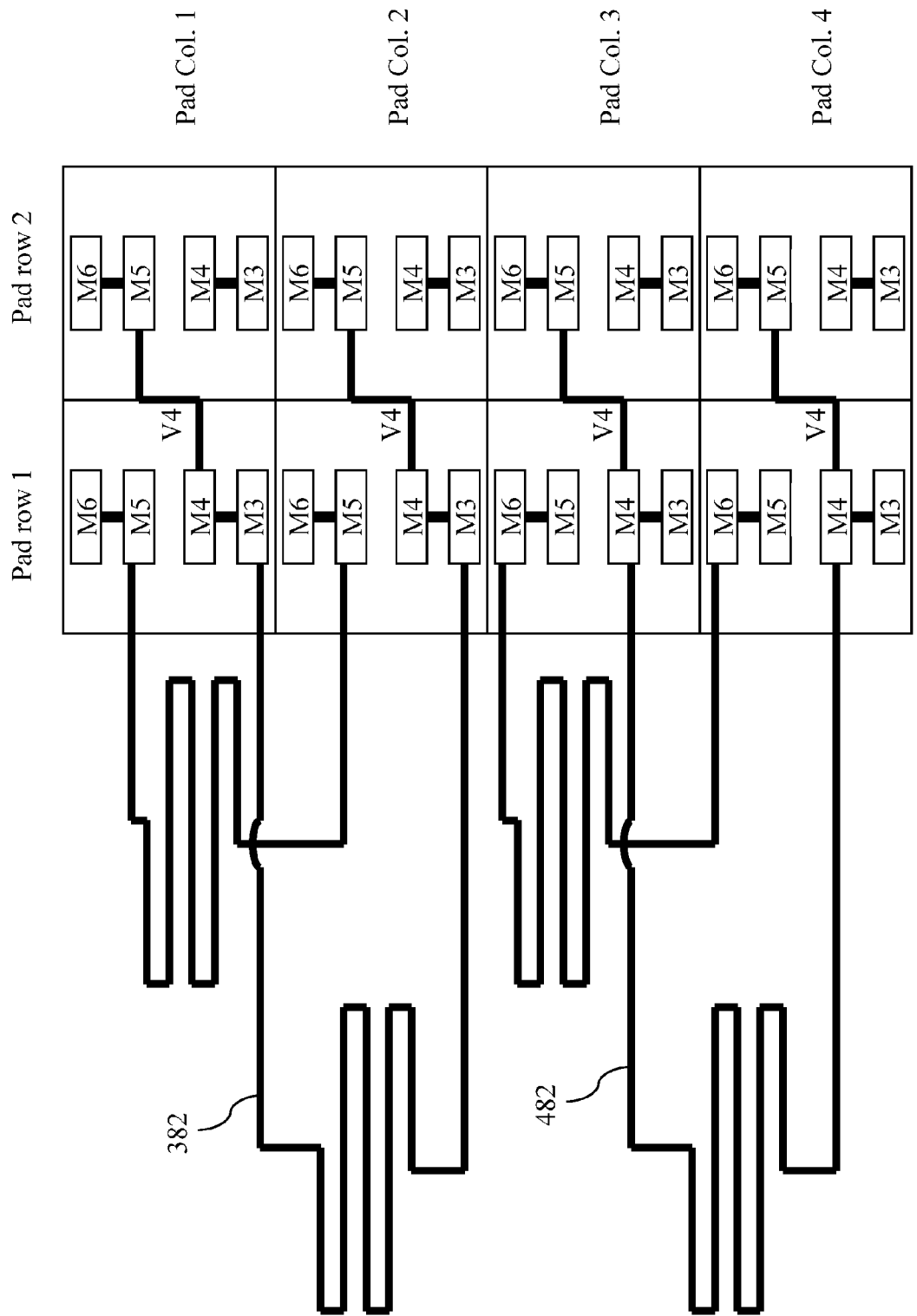
FIG. 14 is a schematic showing electrical connections for various components of the second exemplary metal interconnect structure for the case in which X=4.

Referring to FIG. 14, a schematic shows electrical connections for various components of the second exemplary metal interconnect structure for the case in which X=4. The electrical connection to any BEOL macro shifts laterally to an adjacent row every two line levels. For example, a serpentine macro 382 including contiguous metal lines between an M3 level pad at pad row 1 and pad column 1 and another M3 level pad at pad row 1 and pad column 2 is accessible through a pair of pads in pad row 1 at M3 level and at M4 level. The serpentine macro 382 is accessible through a pair of pads in pad row 2 at M5 and M6 level. The serpentine macro 382 is not accessible through any pads in pad row 1 at M5 and M6 level. If M7 and M8 levels are built according to the scheme of the present invention, the serpentine macro 382 is accessible through a pair of pads in pad row 3 at M7 and M8 level. The serpentine macro 382 is an example of a third line level test structure 380.

Likewise, a serpentine macro 482 including contiguous metal lines between an M4 level pad at pad row 1 and pad column 3 and another M4 level pad at pad row 1 and pad column 4 is accessible through a pair of pads in pad row 1 at M4 level. The serpentine macro 482 is accessible through a pair of pads in pad row 2 at M5 and M6 level. If M7 and M8 levels are built according to the scheme of the present invention, the serpentine macro 482 is accessible through a pair of pads in pad row 3 at M7 and M8 level. The serpentine macro 482 is an example of a fourth line level test structure 380.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A structure comprising, from bottom to top:
   a first line level structure including a first array of first metal pads, wherein a first lateral extension portion protrudes from each of said first metal pads;
   a first via level structure including first metal vias, wherein each of said first metal vias contacts one of said first lateral extension portions and has vertical sidewalls;
   a second line level structure including a second array of second metal pads, wherein a second lateral extension portion protrudes from each of said second metal pads, each of said lateral extension portion contacts one of said first metal vias, and a second metal pad among said second array of said second metal pads which vertically overlies a first metal pad among said first array of said first metal pads is electrically isolated from said first metal pad and is electrically connected to another first metal pad that does not directly underlie said second metal pad; and
   a second via level structure including second metal vias and located above said second line level structure, wherein each of said second metal vias contacts an upper surface of one of said second metal pads and does not contact any of said second lateral extension portions.

2. The structure of claim 1, further comprising a third line level structure including a third array of third metal pads, wherein a third lateral extension portion protrudes from each of said third metal pads, and each of said third lateral extension portions directly overlies one of said first lateral extension portions and each of said third metal pads directly overlies one of said first metal pads.

3. The structure of claim 2, wherein each two-dimensional shape of any structures within a level of said third line level structures directly overlies a congruent two-dimensional shape of a structure within a level of said first line level structures.

4. The structure of claim 2, further comprising a third via level structure including third metal vias, wherein each of said third metal vias contacts one of said third lateral extension portions.

5. The structure of claim 4, wherein each two-dimensional shape of any structures within a level of said third via level structures directly overlies a congruent two-dimensional shape of a structure within a level of said first via level structures.

6. A structure comprising, from bottom to top:
   a first line level structure including a first array of first metal pads, wherein a first lateral extension portion protrudes from each of said first metal pads;
   a first via level structure including first metal vias, wherein each of said first metal vias contacts one of said first lateral extension portions and has vertical sidewalls; and
   a second line level structure including a second array of second metal pads, wherein a second lateral extension portion protrudes from each of said second metal pads, each of said lateral extension portion contacts one of said first metal vias, and a second metal pad among said second array of said second metal pads which vertically overlies a first metal pad among said first array of said first metal pads is electrically isolated from said first metal pad and is electrically connected to another first metal pad that does not directly underlie said second metal pad, wherein said first line level structure, said first via level structure, and said second line level structure are embedded in at least one dielectric material layer located on at least one semiconductor device on a semiconductor substrate.

7. The structure of claim 6, further comprising a second via level structure including second metal vias and located above said second line level structure, wherein each of said second metal vias contacts an upper surface of one of said second metal pads and does not contact any of said second lateral extension portions.

8. The structure of claim 7, further comprising a third line level structure including a third array of third metal pads, wherein a third lateral extension portion protrudes from each of said third metal pads, and each of said third lateral extension portions directly overlies one of said first lateral extension portions and each of said third metal pads directly overlies one of said first metal pads.

9. The structure of claim 8, wherein each two-dimensional shape of any structures within a level of said third line level structures directly overlies a congruent two-dimensional shape of a structure within a level of said first line level structures.

10. The structure of claim 8, further comprising a third via level structure including third metal vias, wherein each of said third metal vias contacts one of said third lateral extension portions.

11. The structure of claim 6, wherein said first array of first metal pads and said second array of second metal pads are two-dimensional arrays with regular spacings in two horizontal directions, wherein each second metal pad in said second array directly overlies a first metal pad in said first array.

12. A structure comprising, from bottom to top:
a first line level structure including a first array of first metal pads, wherein a first lateral extension portion protrudes from each of said first metal pads;
a first via level structure including first metal vias, wherein each of said first metal vias contacts one of said first lateral extension portions and has vertical sidewalls; and
a second line level structure including a second array of second metal pads, wherein a second lateral extension portion protrudes from each of said second metal pads, each of said lateral extension portion contacts one of said first metal vias, and a second metal pad among said second array of said second metal pads which vertically overlies a first metal pad among said first array of said first metal pads is electrically isolated from said first metal pad and is electrically connected to another first metal pad that does not directly underlie said second metal pad, wherein said first array of first metal pads and said second array of second metal pads are two-dimensional arrays with regular spacings in two horizontal directions, wherein each second metal pad in said second array directly overlies a first metal pad in said first array.

13. A structure comprising, from bottom to top:
a first line level structure including a first array of first metal pads, wherein a first lateral extension portion protrudes from each of said first metal pads;
a first via level structure including first metal vias, wherein each of said first metal vias contacts one of said first lateral extension portions and has vertical sidewalls;
a second line level structure including a second array of second metal pads, wherein a second lateral extension portion protrudes from each of said second metal pads, each of said lateral extension portion contacts one of said first metal vias, and a second metal pad among said second array of said second metal pads which vertically overlies a first metal pad among said first array of said first metal pads is electrically isolated from said first metal pad and is electrically connected to another first metal pad that does not directly underlie said second metal pad;
a first line level test structure including metallic structures located in a same level as said first line level structure, said first line level test structure including first metal lines electrically connected to two of said first metal pads; and
a second line level test structure including metallic structures located in a same level as said second line level structure, said second line level test structure including second metal lines electrically connected to two of said second metal pads.

14. A method of forming a metal interconnect structure, said method comprising:
forming a first line level structure on a substrate, wherein said first line level structure comprises a first array of first metal pads embedded in a first dielectric layer, and a first lateral extension portion protrudes from each of said first metal pads; and
forming a first via level structure and a second line level structure on said first line level structure, wherein said first via level structure comprises first metal vias embedded in a second dielectric layer and having vertical sidewalls, each of said first metal vias contacts one of said first lateral extension portions, said second line level structure comprises a second array of second metal pads embedded in said second dielectric layer, a second lateral extension portion protrudes from each of said second metal pads, each of said lateral extension portion contacts one of said first metal vias, and a second metal pad vertically overlying a first metal pad is electrically isolated from said first metal pad and is electrically connected to another first metal pad that does not directly underlie said second metal pad.

15. The method of claim 14, further comprising forming a second via level structure including second metal vias embedded in a third dielectric layer on said second line level structure, wherein each of said second metal vias contacts an upper surface of one of said second metal pads and does not contact any of said second lateral extension portions.

16. The method of claim 15, further comprising forming a third line level structure including a third array of third metal pads embedded in said third dielectric layer, wherein a third lateral extension portion protrudes from each of said third metal pads, and each of said third lateral extension portion directly overlies one of said first lateral extension portions and each of said third metal pads directly overlies one of said first metal pads.

17. The method of claim 16, wherein each two-dimensional shape of any structures within a level of said third line level structures directly overlies a congruent two-dimensional shape of a structure within a level of said first line level structures.

18. The method of claim 16, further comprising forming a third via level structure including third metal vias in said third dielectric layer, wherein each of said third metal vias contacts one of said third lateral extension portions.

19. The method of claim 14, wherein said first array of first metal pads and said second array of second metal pads are formed as two-dimensional arrays with regular spacing in two horizontal directions, wherein each second metal pad in said second array directly overlies a first metal pad in said first array.

20. The method of claim 14, further comprising:
forming a first line level test structure including metallic structures located in a same level as said first line level structure, said first line level test structure comprising first metal lines electrically connected to two of said first metal pads; and
forming a second line level test structure including metallic structures located in a same level as said second line level structure, said second line level test structure comprising second metal lines electrically connected to two of said second metal pads.

* * * * *